(12) United States Patent
Wu

(10) Patent No.: US 7,242,333 B1
(45) Date of Patent: Jul. 10, 2007

(54) ALTERNATE SAMPLING INTEGRATOR

(75) Inventor: Jin-Yong Wu, Phoenix, AZ (US)

(73) Assignee: Medtronic, Inc., Minneapolis, MN (US)

( * ) Notice: Subject to any disclaimer, the term of this patent is extended or adjusted under 35 U.S.C. 154(b) by 0 days.

(21) Appl. No.: 11/323,834

(22) Filed: Dec. 30, 2005

(51) Int. Cl.
*H03M 1/00* (2006.01)

(52) U.S. Cl. ...................... 341/122; 341/120

(58) Field of Classification Search ......... 341/115–155
See application file for complete search history.

(56) References Cited

U.S. PATENT DOCUMENTS

| | | |
|---|---|---|
| 5,025,224 A | 6/1991 | Rhodes |
| 5,092,330 A | 3/1992 | Duggan |
| 5,117,227 A | 5/1992 | Goeke |
| 5,543,795 A | 8/1996 | Fernald |
| 6,184,811 B1 * | 2/2001 | Nagari et al. ................ 341/143 |
| 6,194,946 B1 * | 2/2001 | Fowers ........................ 327/337 |
| 6,323,801 B1 * | 11/2001 | McCartney et al. ........ 341/172 |
| 6,393,070 B1 * | 5/2002 | Reber .......................... 375/340 |
| 6,509,790 B1 | 1/2003 | Yang |
| 6,738,003 B2 * | 5/2004 | Melanson .................... 341/143 |
| 6,744,394 B2 * | 6/2004 | Liu et al. .................... 341/155 |
| 6,809,672 B2 | 10/2004 | Gupta |
| 6,894,633 B2 | 5/2005 | Sivard |
| 6,897,720 B2 * | 5/2005 | Fujimoto ........................ 330/9 |

* cited by examiner

*Primary Examiner*—Lam T. Mai
(74) *Attorney, Agent, or Firm*—Girma Wolde-Michael; Carol F. Barry

(57) ABSTRACT

An alternate sampling integrator circuit is disclosed that can concurrently sample and integrate signals received at an input. The circuit may include multiple sampling capacitors, an operational amplifier, and multiple switches. The switches switch the capacitors between a sampling mode and an integration mode.

11 Claims, 8 Drawing Sheets

ALTERNATE SAMPLING INTEGRATOR

BACKGROUND SECTION

Many embodiments of the disclosure relate generally to electronic integrator circuits, and more particularly, to such circuits utilizing multiple sampling capacitors.

Electronic integrator circuits are devices which produce an electronic output signal which is proportional to the integral of the input signals that they receive. Such devices generally have use in mixed signal applications, for example, in analog-to-digital converters (ADCs); however, such devices also have use in a wide variety of other applications as well. Generally, in such applications, the integrator circuit is used to approximate the mathematical process of integration, that is, sample and integrate an input analog signal over a given period of time.

A commonly known integrator circuit 10 is shown in FIG. 1. As illustrated, the circuit 10 is a switched-capacitor integrator. The circuit 10 involves a number of electrical components including an operational amplifier 12 and two capacitors, a sampling capacitor 14 and an integrating capacitor 16. In addition, a number of switches, 18, 20, 22, and 24, are used to provide an integrating operation. As is known, the switches 18, 20, 22, and 24 are typically operated in distinct phases. For example, in a first phase or sampling phase, switches 18 and 22 are closed while switches 20 and 24 are open. As such, the back end of the sampling capacitor 14 is electrically connected to the input voltage 26 while the front end of the sampling capacitor 14 is grounded. The sampling capacitor 14 is subsequently charged during such sampling phase via the input voltage 26. During a subsequent phase or integrating phase, switches 20 and 24 are closed while switches 18 and 22 are open. In turn, the back end of the sampling capacitor 14 is grounded while the front end of the sampling capacitor 14 is electrically connected to the operational amplifier 12 and the integrating capacitor 16. The voltage on the sampling capacitor 14 is generally discharged to the integrating capacitor 16 via the operational amplifier 12 during such integrating phase.

As shown, since the positive input of the operational amplifier 12 is connected to ground, the voltage at the negative input of the amplifier 12 will almost be the same as the voltage at ground (e.g., virtual ground). In turn, when the input impedance of the operational amplifier 12 is high, the current flowing from the sampling capacitor 14 is generally found to be the same as the current observed flowing through the integrating capacitor 16. As such, the charge placed across the integrating capacitor 16 is generally the same as what is discharged from the sampling capacitor 14. In turn, the voltage gain of the integrator circuit 10 generally equals the ratio between the capacitance of the sampling capacitor 14 and the capacitance of the integrating capacitor 16.

As is generally known, when the output of the integrator circuit 10 of FIG. 1 is electrically coupled to an input of a comparator (not shown), the comparator output following the integrating phase of the integrator circuit 10 can be used in controlling subsequent input reference voltage (not shown) to the integrating capacitor 16. The change of the output voltage of the integrator circuit 10 in the end of a clock cycle will be the input voltage 26 added to either a positive or negative reference voltage, depending on the prior output of the comparator.

As is to be appreciated from the above discussion involving prior art integrator circuit 10, the sampling and integrating phases are distinct. The speed of the integrator circuit 10 can often be limited by these two phases. For example, further sampling by the sampling capacitor 14 during a subsequent sampling phase can only begin after the sampling capacitor 14 is fully discharged and the operational amplifier 12 is stabilized, ending the integrating phase. Likewise, further integration by the integrating capacitor 16 can only begin after the sampling capacitor 14 again is charged, ending the sampling phase. In summary, the integrating phase is only started after completion of the sampling phase, and vice versa.

Expanding on the above, if a multi-stage circuit is designed with multiple integrator stages (each stage including an integrator circuit, e.g., as shown in FIG. 1), the operation of the multi-stage circuit can be negatively impacted by the distinct sampling and integrating phases of each integrator stage. In such circuits, a sampling capacitor of a subsequent stage integrator acts as a load on an operational amplifier of a previous stage. Therefore, the operational amplifier of the previous stage needs time to be stabilized before being sampled by the subsequent stage. This is because the output of the operational amplifier (of the previous stage) can be disturbed via a sudden connection to the sampling capacitor (of the subsequent stage). Sufficient time is, therefore, often needed before the voltage sampled by such sampling capacitor is stabilized. Often, if the sampling period begins prior to such stabilization, the multi-circuit can be found to provide erroneous output.

SUMMARY

Certain embodiments of the invention relate to apparatus involving an alternate sampling integrator circuit that can concurrently sample and integrate signals received at an input. The circuit may include multiple sampling capacitors, an operational amplifier, and multiple switches. The switches switch the capacitors between a sampling mode and an integration mode.

In some embodiments, an integrator is provided, comprising circuitry including an operational amplifier and first and second sampling capacitors. The capacitors are positioned along separate signal paths and each in series with an analog signal input and an input of the operational amplifier. The circuitry is configured to concurrently sample and integrate signals received at the analog signal input.

In other embodiments, an integrator is provided, comprising a switched capacitor sampling network having an input for receiving an analog signal. A first portion of the sampling network is in a sampling mode during a first phase of a clock and is in an integrating mode during a second phase of the clock. A second portion of the sampling network is in the integrating mode during the first phase of the clock and is in the sampling mode during the second phase of the clock.

In other embodiments, an integrator circuit is provided, comprising an operational amplifier and first and second sampling capacitors positioned along separate signal paths and each in series with an analog signal input and an input of the operational amplifier. The first and second sampling capacitors sample signals received at the analog input, the operational amplifier integrates signals received at the first input, and the signal paths alternate oppositely between sampling and integrating modes of operation.

DETAILED DESCRIPTION OF THE PREFERRED EMBODIMENTS

Figure 1:
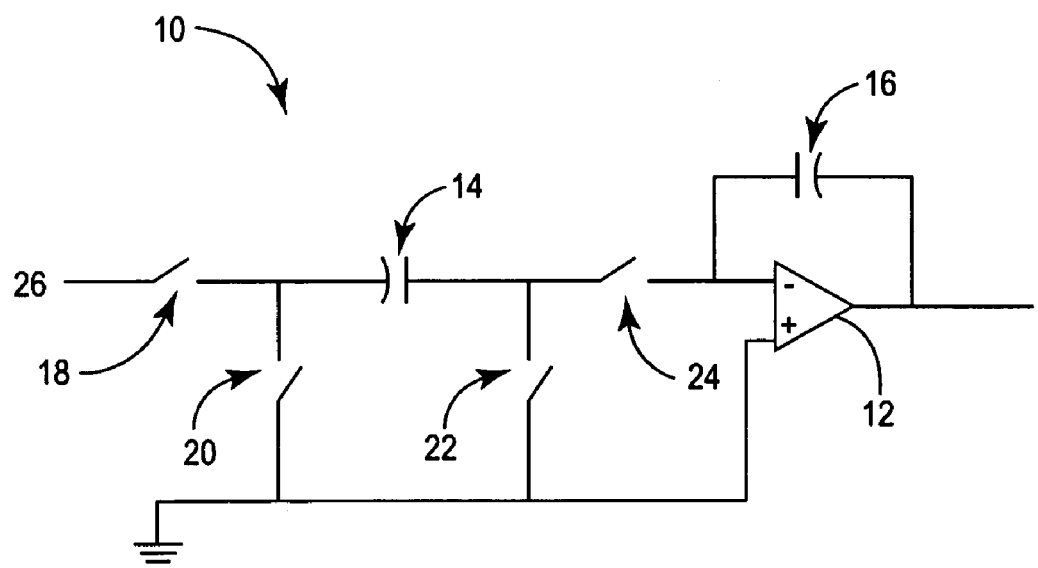
FIG. 1 is an exemplary prior art integrator circuit.

The following discussion is presented to enable a person skilled in the art to make and use the present teachings. Various modifications to the illustrated embodiments will be readily apparent to those skilled in the art, and the generic principles herein may be applied to other embodiments and applications without departing from the present teachings. Thus, the present teachings are not intended to be limited to the embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of the present teachings.

Skilled artisans will recognize the examples provided herein have many useful alternatives and fall within the scope of the present teachings. For example, certain exemplary circuit applications are illustrated and discussed herein with specific application to analog-to-digital converter circuits; however, it is to be appreciated that embodiments of the invention are just as applicable to any type of circuit using integrator circuits. In addition, while the exemplary circuit applications are illustrated and discussed herein with respect to specific analog-to-digital converter circuits; it is to be appreciated that embodiments of the invention can be also applied in other types of analog-to-digital converter circuits as well.

Figure 2:
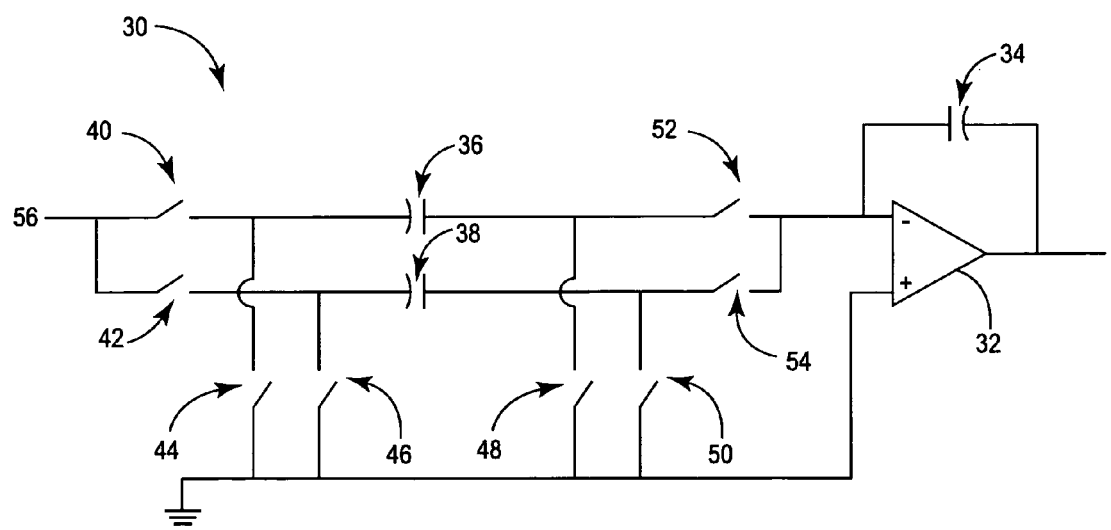
FIG. 2 is an integrator circuit in accordance with certain embodiments of the invention.

FIG. 2 illustrates an integrator circuit 30 in accordance with certain embodiments of the invention. Similar to the circuit 10 shown in FIG. 1, the integrator circuit 30 includes an operational amplifier 32 and an integrating capacitor 34. However, the integrator circuit 30 also includes a first sampling capacitor 36 and a second sampling capacitor 38. The integrator circuit 30 also has a plurality of switches to provide the circuit operation, as described herein. As shown, in certain embodiments, the integrator circuit 30 includes switches 40, 42, 44, 46, 48, 50, 52, and 54. As should be appreciated, one can refer to the operational amplifier 32, the integrating capacitor 34, the first and second sampling capacitors 36, 38, and the switches 40–54 as a switched capacitor sampling network in light of their functioning, as described below.

Similar to the switches 18–24 in the integrator circuit 10 of FIG. 1, the switches 40–54 of the integrator circuit 30 can be generally operated in distinct phases. For example, in a first phase, the switches 40, 48 and 46, 54 are closed while the other switches 42, 50 and 44, 52 are open. As such, the first sampling capacitor 36 is charged via the input voltage 56 and the voltage on the second sampling capacitor 38 is generally discharged to the integrating capacitor 34 via the operational amplifier 32. During a second phase, the switches 42, 50 and 44, 52 are closed while switches 40, 48 and 46, 54 are open. As such, the second sampling capacitor 38 is charged via the input voltage 56 and the voltage on the first sampling capacitor 36 is generally discharged to the integrating capacitor 34 via the operational amplifier 32.

Figure 11:
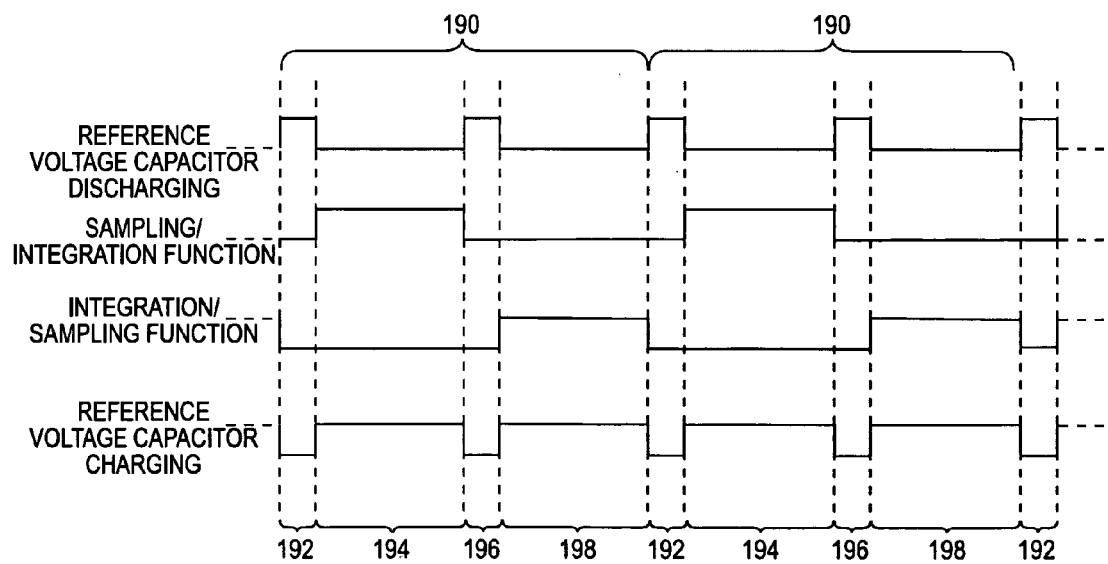
FIG. 11 is a time diagram for the integrator circuit of FIG. 10.

In contrast to the integrator circuit 10 of FIG. 1, each of the phases described above with respect to the integrator circuit 30 involves both sampling and integrating functions. As should be appreciated, because of the combination of these sampling and integrating functions in its operating phases, the integrator circuit 30 can function nearly twice as fast as the integrating circuit 10 of FIG. 1. However, as should be appreciated, even with this overall increase in circuit speed, the current consumption for the integrating circuit 30 is generally about the same as for the circuit 10 of FIG. 1. In addition, as further described herein, if the integrator circuit 30 is used in multiple stages of a multi-stage system (e.g., as shown in FIG. 11), instead of waiting to connect the sampling capacitor of a subsequent stage to the output of the operational amplifier of a previous stage after the amplifier is stabilized, the design of the integrator circuit 30 enables the sampling capacitor of the subsequent stage to be connected to the output of the operational amplifier of the previous stage during the corresponding integrating phase of the operational amplifier. In turn, the operational amplifier of the previous stage is stabilized while the sampling capacitor of the subsequent stage is connected as part of the amplifier's load. As such, there is no sudden connecting of the sampling capacitor of the subsequent stage to the output of the operational amplifier of the previous stage, and stabilization of the operational amplifier occurs during the normal integrating phases of the operational amplifier. In turn, the speed of the multi-stage system is increased.

Figure 3:
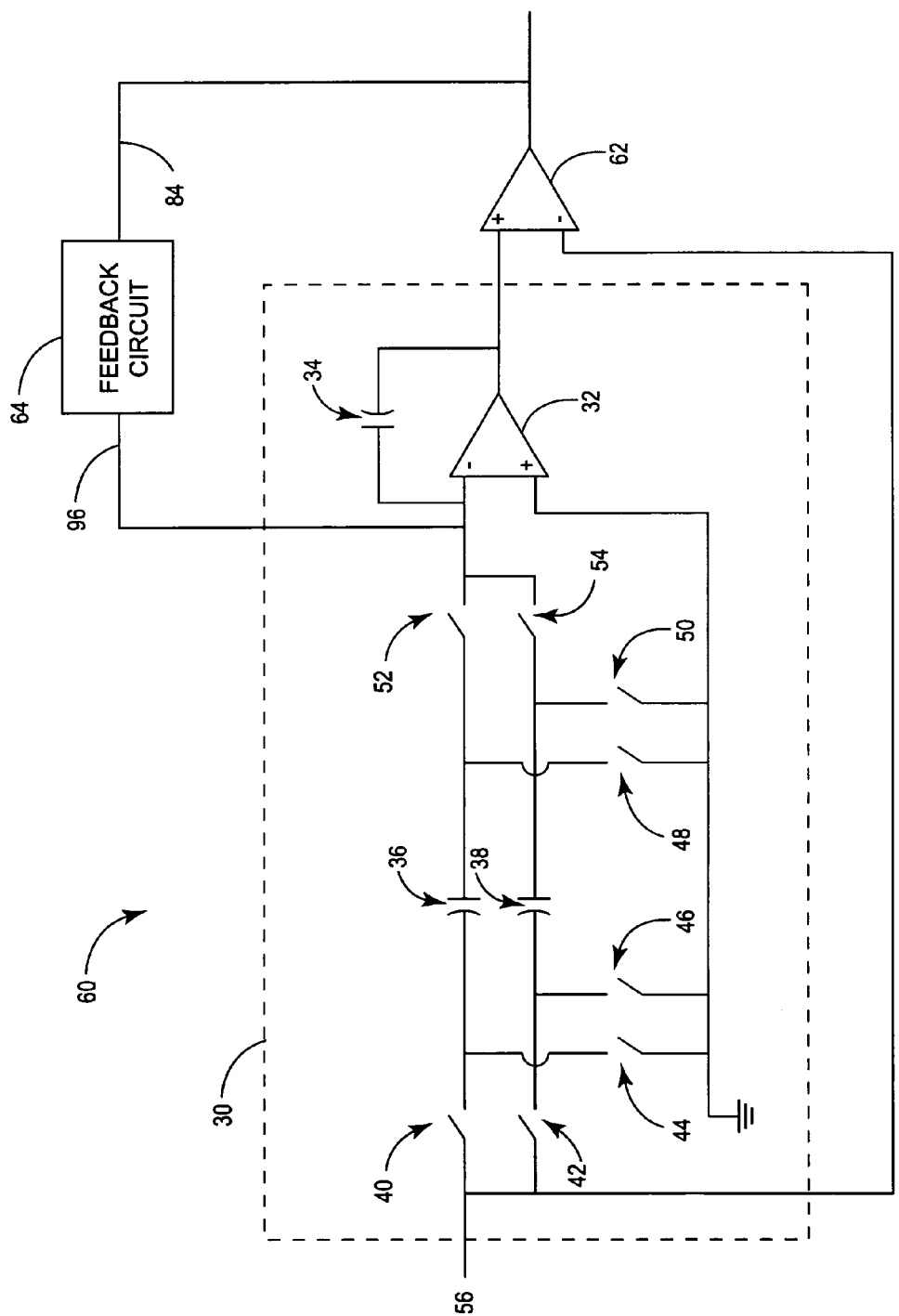
FIG. 3 is a part of an ADC circuit including the integrator circuit of FIG. 2.

As mentioned herein, circuits employing integrators have a wide variety of applications, with many of these applications falling in the area of mixed signal electronics. As further mentioned, one particular circuit type in the area of mixed signal electronics in which integrators are often employed is an ADC circuit (e.g., an incremental ADC circuit). Part of an exemplary ADC circuit 60 is shown in FIG. 3 in accordance with certain embodiments of the invention. As illustrated, the partial ADC circuit 60 is a first-order, single-stage circuit, and includes the integrator circuit 30 of FIG. 2, a comparator 62, and feedback circuit 64. The comparator 62 is generally configured to compare the output of the integrator circuit 30 with a reference voltage, e.g., the input voltage 56. As is generally known, the output of the comparator 62 is either high (e.g., digital output "1") or low (e.g., digital output "0") based upon its comparison of the inputs to the comparator 62. Subsequently, as is generally known, the feedback circuit 64, via a feed-back loop stemming from the output of the comparator 62, can be used to select a voltage charged to one or more reference voltage capacitors (part of the feedback circuit 64, and not shown in FIG. 3) based on the value of the comparator output. As is described below with reference to FIG. 4, embodiments of the invention involve the feedback circuit 64 being used to select one of at least two reference voltages (exemplified as either 92 or 94 in FIG. 4). In turn, the subsequent output voltage of the integrator circuit 30 can be provided as the input signal 56 added to one of the reference voltages based on the value of the comparator output 84.

Similar to the integrator circuit 30 of FIG. 2, the ADC circuit 60 operates in at least two phases. As described above, in one phase, the first sampling capacitor 36 is charged via the input voltage 56 and the voltage on the second sampling capacitor 38 is generally discharged to the integrating capacitor 34 via the operational amplifier 32. The output voltage of the operational amplifier 32 charging the integrating capacitor 34 is likewise applied to the input of the comparator 62. As shown, the output of the comparator 62 forms an input to the feedback circuit 64. Depending on the output of the comparator 62, the feedback circuit 64 adds one of at least two reference voltages (exemplified as either 92 or 94 in FIG. 4) to be charged on one or more reference voltage capacitors (referenced as 72 in FIG. 4) of the feedback circuit 64. Similarly, in a further phase, the second sampling capacitor 38 is further charged via the input voltage 56 and the voltage on the first sampling capacitor 36 is generally discharged to the integrating capacitor 34 via the operational amplifier 32. The output voltage of the operational amplifier 32 charging the integrating capacitor 34 is likewise applied to the input of the comparator 62. As described above, the output of the comparator 62 is input to the feedback circuit 64. Depending on the output of the comparator 62, the feedback circuit 64 adds one of at least two reference voltages (again exemplified as either 92 or 94 in FIG. 4) to be charged on one or more reference voltage capacitors (referenced as 72 in FIG. 4). As such, via use of the feedback circuit 64, in every phase of the partial ADC circuit 60, one of the sampling capacitors 36 or 38 and one of the reference voltage capacitors of the feedback circuit 64 transfer their corresponding charges onto the integrating capacitor 34.

Figure 4:
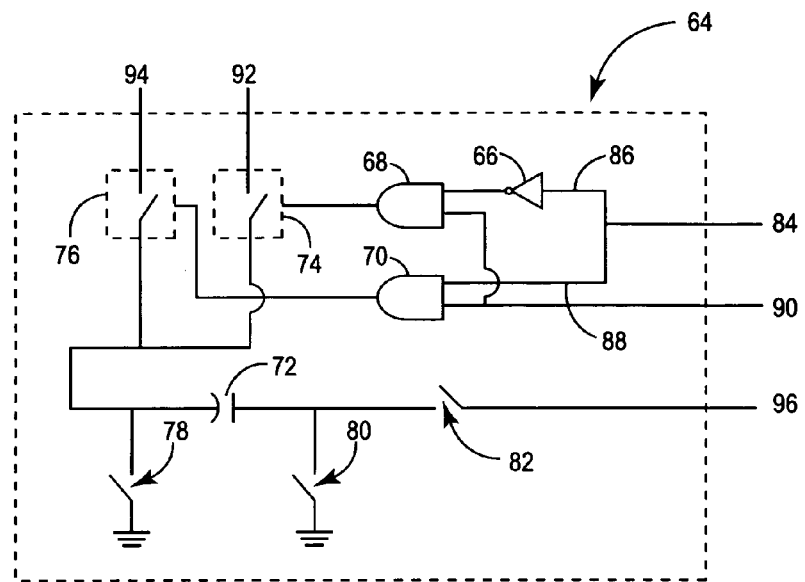
FIG. 4 is an exemplary feedback circuit of the partial ADC circuit of FIG. 3 in accordance with certain embodiments of the invention.

FIG. 4 shows various components of the feedback circuit 64 in accordance with certain embodiments of the invention. As illustrated, in certain embodiments, the feedback circuit 64 includes a NOT gate 66, a pair of AND gates 68 and 70, a reference voltage capacitor 72 and a plurality of switches. In certain embodiments, the feedback circuit 64 includes switches 74, 76, 78, 80, and 82. In use, the output of the comparator 62 (shown in FIG. 3) is connected to an input 84 of the feedback circuit 64. As shown, the input 84 is divided into two signal paths 86 and 88. The signal paths 86 and 88 are each connected to a first input of respective AND gates 68 and 70; however, one of the signal paths, e.g., signal path 86, is sent through the NOT gate 66 prior to its connection to its corresponding AND gate, e.g., AND gate 68. The second input of each of the AND gates 68, 70 is connected to a control signal 90. As shown, each of the outputs of the AND gates are connected to control ends of the switches 74 and 76, which are respectively connected to one of two reference voltages, e.g., as shown, switch 74 is connected to a positive reference voltage 92 and switch 76 is connected to a negative reference voltage 94. In certain embodiments, as shown in FIG. 3, the output 96 of the switch 82 is connected to the negative input of the operational amplifier 32.

In certain embodiments, the switches referenced herein with respect to the integrator circuits 30 and 110 (shown in FIGS. 2 and 6 respectively), the partial ADC circuits 60 and 160 (shown in FIGS. 3 and 7 respectively), and the exemplary feedback circuits 64 and 64' (shown in FIGS. 4 and 8 respectively) are analog switches. As is known, each analog switch has three ends, one control end and two switch poles. In certain embodiments, the control end of each switch is connected to a digital control signal. In turn, when the digital control signal is logic "1", the switch is on. Conversely, when the digital control signal is logic "0", the switch is off. As is known, the switch poles for each switch are used to connect or separate two analog signals. In addition, the control end of each switch is electrically isolated from the corresponding switch poles. To simplify the above-referenced Figures provided herein, the control ends of most switches are not shown.

As should be appreciated, referencing the circuit representation exemplified in FIG. 4, if the output signal of the comparator 62 is logic "1", the signal will be changed to logic "0" by the NOT gate 66 along signal path 86. As such, this logic "0" signal seen by the corresponding AND gate 68 will not enable the corresponding switch 74 to close (regardless of whether the control signal 90 is present), and thus not connect the high reference voltage 92 to the corresponding end of the reference voltage capacitor 72. However, the logic "1" output signal of the comparator 62 will be seen by the corresponding AND gate 70. In turn, the logic "1" signal will enable the corresponding switch 76 to close when the control signal 90 is present, thereby connecting the low reference voltage 94 to the corresponding end of the reference voltage capacitor 72. Conversely, if the output signal of the comparator 62 is logic "0", the signal will be changed to logic "1" by the NOT gate 66 along signal path 86. As such, this logic "1," signal seen by the corresponding AND gate 68 will enable the corresponding switch 74 to close when the control signal 90 is present, thereby connecting the high reference voltage 92 to the corresponding end of the reference voltage capacitor 72. However, the logic "0" output signal of the comparator 62 will be seen by the corresponding AND gate 70, and in turn will not enable the corresponding switch 76 to close (regardless of whether the control signal 90 is present), and thus not connect the low reference voltage 94 to the corresponding end of the reference voltage capacitor 72. As such, by the circuit design, only one reference voltage, 92 or 94, is connected by the feedback circuit 64. As should be appreciated, a wide variety of different logic circuit designs can be designed to accomplish the above, and as such, the invention should not be limited solely to the above embodiment.

As shown, the signal paths 86 and 88 are combined following their exit from the switches 74 and 76 and are connected to a front end of the reference voltage capacitor 72. As shown, the switch 78 is connected to a front end of the reference voltage capacitor 72 and the switch 80 is connected to a back end of the reference voltage capacitor 72. Further, switch 82 is connected between the reference voltage capacitor 72 and an output 96 of the feedback circuit 64. As already described, in certain embodiments, the output 96 of the feedback circuit 64 is, in turn, connected to the negative input end of the operational amplifier 32 of the integrating circuit 30 (shown in FIG. 3).

Figure 5:
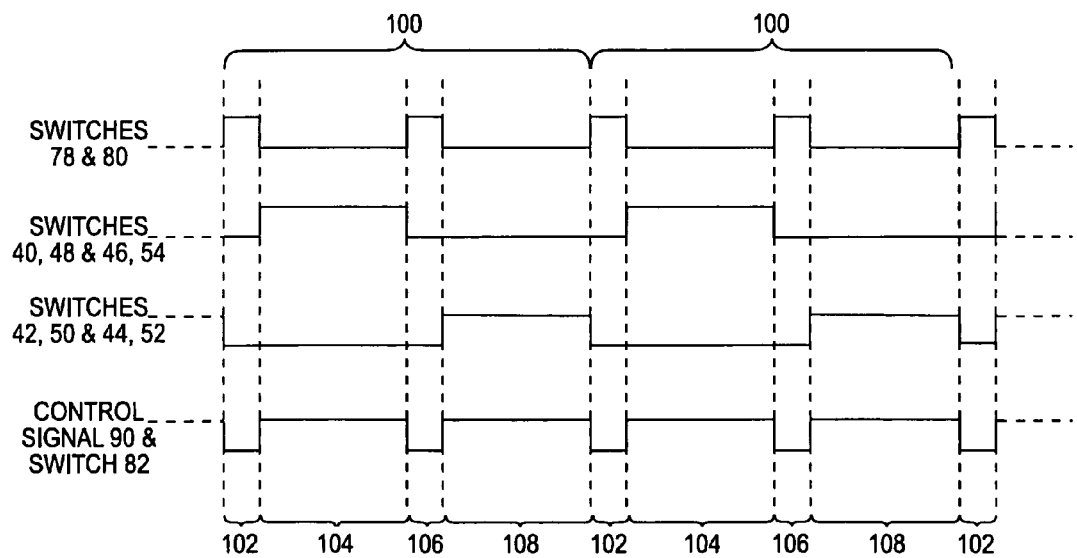
FIG. 5 is a time diagram for the partial ADC circuit of FIGS. 3 and 4.

FIG. 5 shows a block diagram corresponding to the functioning of the circuits of FIGS. 3 and 4 in accordance with certain embodiments of the invention. As described above, the integrating circuit 30 of FIG. 3 generally functions in two phases. As also described, each of these phases involves sampling and integrating functions of the integrating circuit 30. When the integrating circuit 30 is used as a component of a larger circuit, as exemplified in FIG. 3, the integrating circuit 30 still operates in two phases of every clock cycle. For example, these two phases are generally shown in FIG. 5 as phases 104 and 106, and generally take place during every clock cycle 100 of the partial ADC circuit 60. However, the clock cycle of a larger circuit incorporating the integrator circuit 30 (e.g., the partial ADC circuit 60 of FIG. 3) may be extended for a variety of reasons. This is exemplified in the clock cycles 100 represented in the diagram of FIG. 5. As shown, each clock cycle 100 has a first phase 102, the second phase 104, a third phase 106, and the fourth phase 108. As such, the clock cycle 100 is extended by such first and third phases 102 and 106. As described below, in certain embodiments, the first and third phases 102 and 106 each involve the discharging of the reference voltage capacitor 72 in the feedback circuit 64 of the partial ADC circuit 60 prior to the initiation of the respective second and fourth phases 104 and 108. It should be appreciated that the use of the integrator circuit 30 of FIG. 2 would not always require the inclusion of such first and third phases 102 and 106 to its clock cycle. As such, while the circuit of FIG. 3 and clock diagram of FIG. 5 illustrate certain applications for the integrator circuit 30 of FIG. 2, the integrator circuit 30 should not be so limited.

As shown be appreciated, like the integrator circuit 30, the comparator 62 of the partial ADC circuit 60 also generally operates during every second phase 104 and fourth phase 108 of the clock cycle 100. During each such phase, the comparator performs a sampling function and an output function. During the second and fourth phases 104 and 108 of the clock cycle 100, the comparator 62 samples the output of the integrator circuit 30, and at the end of such corresponding phases, the output of the comparator 62 is updated based on any modification to the output of the integrator circuit 30. In turn, the output of the comparator 62 does not change until the end of the next occurring second phase 104 or fourth phase 108.

With reference to FIGS. 3 and 4, in certain embodiments, during the first and third phases 102 and 106 of each clock cycle 100 of FIG. 5, only the switches 78 and 80 of the feedback circuit 64 shown in FIG. 4 are closed, while the control signal 90 is switched low and the other switches 40–54, 74–76, and 82 are opened. As such, in certain embodiments, the first phase 102 involves both sides of the reference voltage capacitor 72 being connected to ground via the switches 78 and 80, resulting in complete discharge of the reference voltage capacitor 72 prior to the beginning of the second phase 104.

The time period required to discharge the reference voltage capacitor 72 in the first and third phases 102, 106 is generally short in comparison to the time periods required for the sampling/integrating phases of the integrator circuit 30 (i.e., the second and fourth phases 104, 108 of the ADC circuit 60). As should be appreciated, the ADC circuit 60 of FIG. 3 may even be designed without the first and third phases 102, 106. As shown, the time periods of each of the first and third phases 102, 106 can be the same; however, the invention should not be limited as such.

With reference to FIGS. 3–5, following discharge of the reference voltage capacitor 72 in the first phase 102 of the clock cycle 100, the control signal 90 is switched high and the switches 40, 48 and 46, 54 and 82 are closed in the second phase 104, while the other switches 42, 44, 50, 52, 78 and 80 are opened. As such, as described above with reference to FIG. 3, the first sampling capacitor 36 is charged via the input voltage 56 and the voltage on the second sampling capacitor 38 is generally discharged to the integrating capacitor 34 via the operational amplifier 32. The output voltage of the operational amplifier 32 charging the integrating capacitor 34 is likewise applied to the input of the comparator 62. As shown in FIGS. 3–4, the output of the comparator 62 feeds into the input 84 of the feedback circuit 64 and is applied to both of the signal paths 86, 88 therein. As described above with reference to FIG. 4, depending on the output of the comparator 62, one of the reference voltages, 92 or 94, is applied to the corresponding end of the reference voltage capacitor 72. In turn, the corresponding reference voltage 92 or 94 provides a subsequent charge to the integrating capacitor 34.

As shown, the time periods of each of the second and fourth phases 104, 108 can be the same; however, the invention should not be limited as such. In certain embodiments, in order to increase the operating speed of the ADC circuit 60, the time period for the second and fourth phases 104, 108 is generally limited, but only to an extent that during such time periods, the sampling and integration functionalities of the corresponding phases can be completed.

Following completion of the second phase 104 of each clock cycle 100, the third phase 106 begins. As such, as illustrated in FIG. 5, only the switches 78 and 80 of the feedback circuit 64 shown in FIG. 4 are closed, while the control signal 90 is switched low and the other switches 40–54, 74–76, and 82 are opened. As such, both sides of the reference voltage capacitor 72 are again connected to ground via the switches 78 and 80, resulting in complete discharge of the reference voltage capacitor 72 prior to the beginning of the fourth phase 108.

With continued reference to FIGS. 3–5, following discharge of the reference voltage capacitor 72 in the third phase 106 of the clock cycle 100, the control switch 90 is switched high and the switches 42, 50 and 44, 52 and 82 are closed in the fourth phase 108, while the other switches 40, 46, 48, 54, 78, and 80 are opened. As such, as described above with reference to FIG. 3, the second sampling capacitor 38 is charged via the input voltage 56 and the voltage on the first sampling capacitor 36 is generally discharged to the integrating capacitor 34 via the operational amplifier 32. As described above with respect to phase two 104, the output voltage of the operational amplifier 32 charging the integrating capacitor 34 is likewise applied to the input of the comparator 62. As shown in FIGS. 3–4, the output of the comparator 62 (which is set at the end of second phase 104) feeds into the input 84 of the feedback circuit 64 and is applied to both of the signal paths 86, 88 therein. As described above with reference to FIG. 4, depending on the output of the comparator 62, one of the reference voltages, 92 or 94, is applied to the corresponding end of the reference voltage capacitor 72. In turn, the corresponding reference voltage 92 or 94 provides a subsequent charge to the integrating capacitor 34.

As should be appreciated, the second and fourth phases 104, 108 of the ADC circuit 60 could be switched with each other in the clock cycles 100 of FIG. 5 without having any effect on the functioning of the circuit 60. The second and fourth phases 104, 108 are merely described and illustrated above for exemplary purposes. In turn, the invention should not be limited as such.

As described above, and illustrated with reference to FIGS. 2–3, certain embodiments of the invention can involve a single input (e.g., referenced as 56 in FIGS. 2–3) to the integrator circuit 30, in which analog signals are only provided to one input of the operational amplifier 32, while the other operational amplifier input is connected to ground.

However, it is often the case that two inputs are provided to the integrator circuit 30 so as to provide a differential input to the operational amplifier 32 of the circuit 30 instead of a single signal input and a connection to ground as shown in FIG. 2. One reason for using this practice is to decrease the amount of common mode noise that can tend to feed into the circuit 30.

Figure 6:
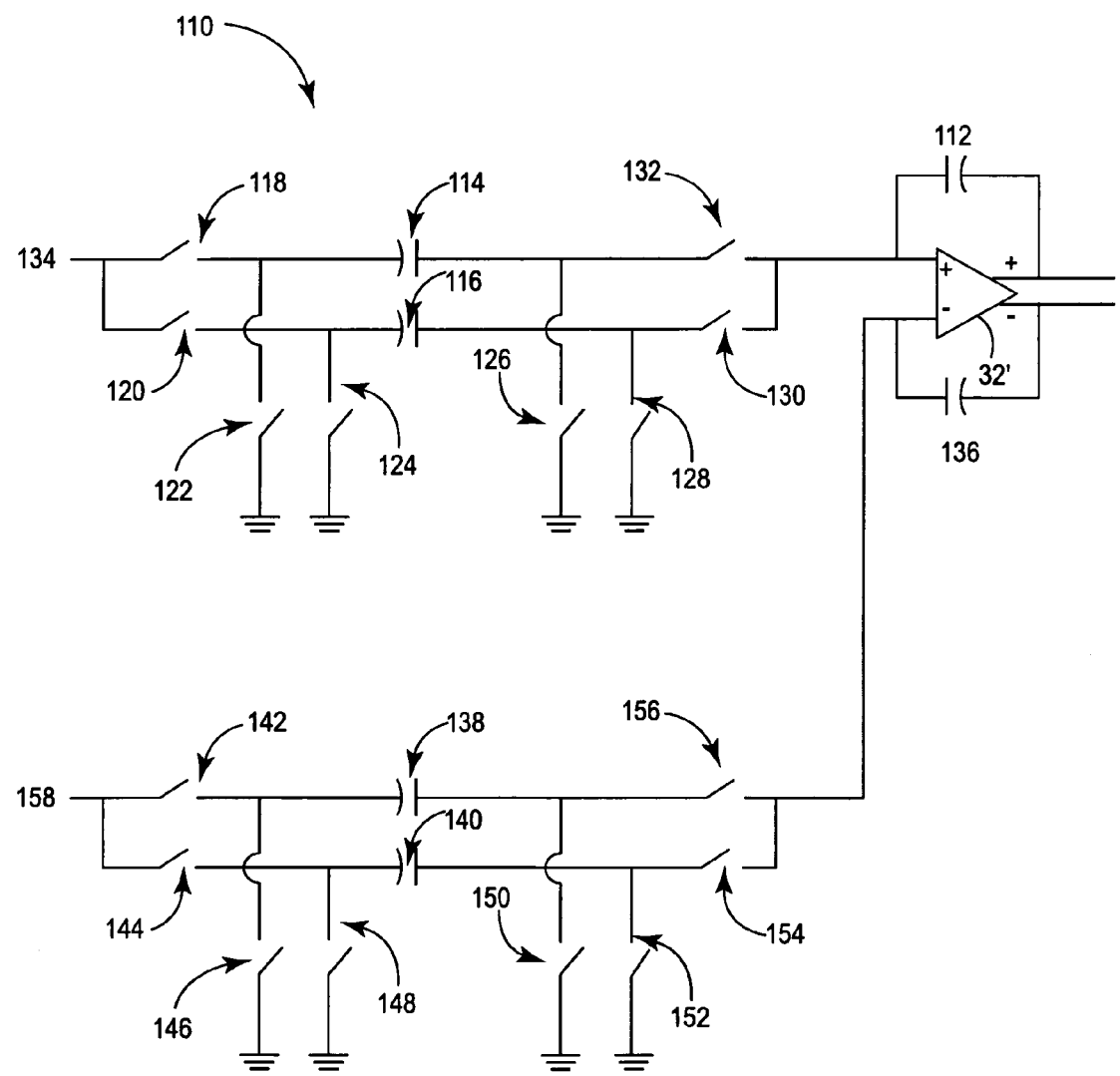
FIG. 6 is a further integrator circuit in accordance with certain embodiments of the invention.

FIG. 6 shows an integrator circuit 110 having a differential input in accordance with certain embodiments of the invention. As can be appreciated, the electrical structure of the circuit 110 is similar to what was previously described above with respect to the integrator circuit of FIG. 2, except the electrical components are generally doubled in quantity (except for the operational amplifier 32', where a fully differential operational amplifier is used instead of a single output differential operational amplifier) to account for the dual signals being accepted by the integrator circuit 110 and passed through the operational amplifier 32'. Given this, it is to be appreciated that the operation of the integrator circuit 110 generally functions in the same fashion as the integrator circuit of FIG. 2, except for the sampling and integrating functions for both inputs being provided simultaneously. As such, the operation of the integrator circuit 110 will only be briefly described below.

The integrator circuit 110 has two voltage inputs 134 and 158 (i.e., differential signals). As such, each of the voltage inputs 134 and 158 are sampled and integrated via sampling capacitors 114, 116 and 138, 140 and corresponding integrating capacitors 112 and 136, via an opening and closing of a respective series of switches, 118–132 and 142–156. Each of the series of switches 118–132 and 142–156 corresponding to the voltage inputs 134, 158 of the integrator circuit 110 function in a similar fashion to the switches 40–54 corresponding to the voltage input 56 of the integrator circuit 30 of FIG. 2. As should be appreciated, the same advantages described above with respect to the integrator circuit 30 of FIG. 2 regarding circuit speed and current consumption hold true for the integrator circuit 110 in comparison to other known integrator circuits having a differential input.

Figure 7:
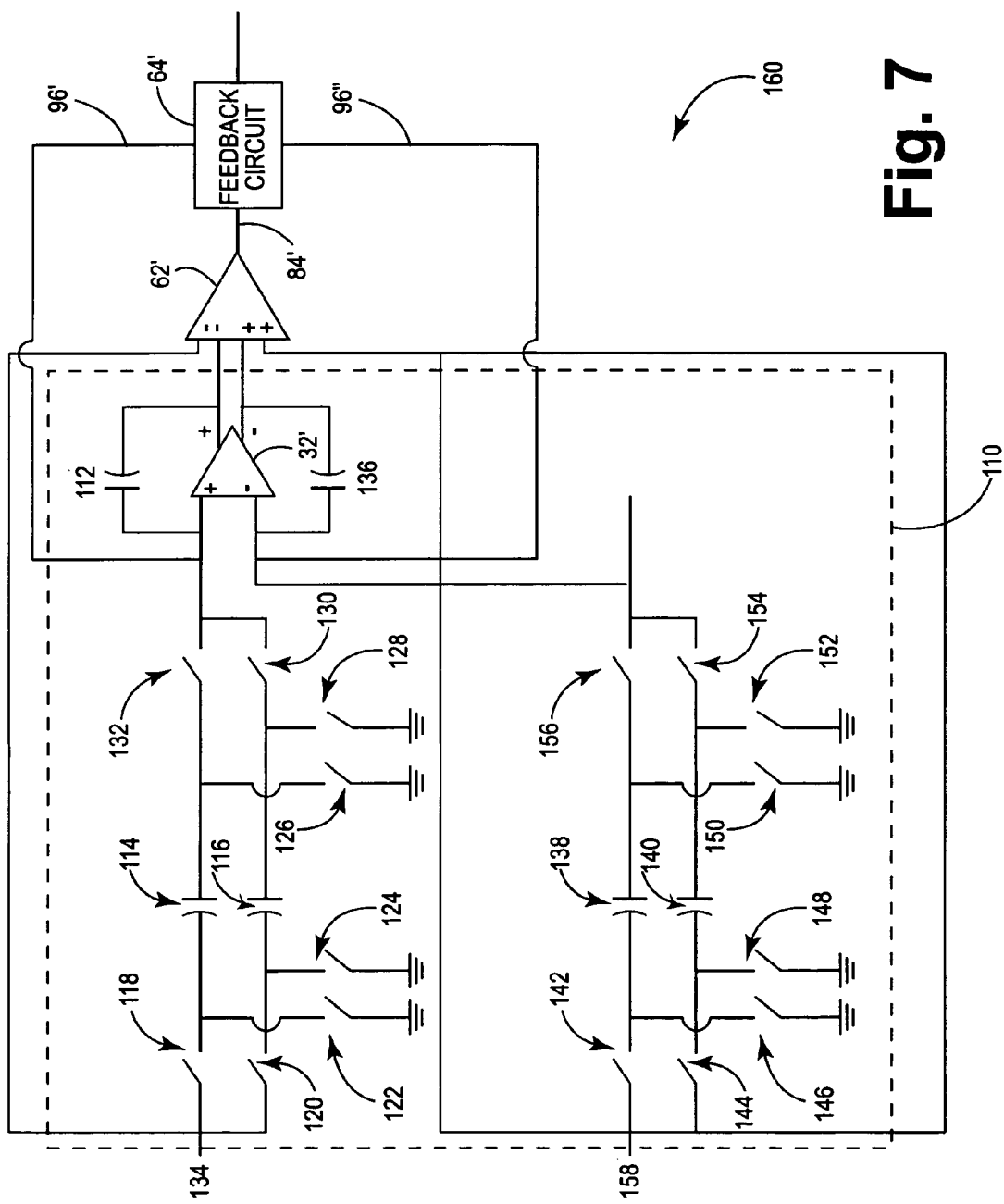
FIG. 7 is a part of an ADC circuit including the integrator circuit of FIG. 6.

As should be appreciated, circuits such as the integrator circuit 110 can also be widely applied with respect to applications in the area of analog and mixed signal electronics. As described above, one particular circuit type in the area of mixed signal electronics in which such integrator circuits are often employed is an ADC circuit (e.g., an incremental ADC circuit). Part of an exemplary ADC circuit 160 is shown in FIG. 7 in accordance with certain embodiments of the invention.

As illustrated, the ADC circuit 160 is a first-order, single-stage circuit, including the integrator circuit 110 of FIG. 6, a four-input comparator 62', and a feedback circuit 64'. As can be appreciated, the ADC circuit 160 generally incorporates the same structure that has been previously discussed herein. As such, the ADC circuit 160 functions in a similar fashion to the ADC circuit 60 of FIG. 3, and will not be further discussed but for a few exceptions. Since the integrator circuit 110 included in the ADC circuit 160 has two voltage inputs 134 and 158, the integrator circuit 110 likewise has two outputs which corresponding feed into the four-input comparator 62'. In addition, since the integrator circuit 110 has the two voltage inputs 134 and 158, the feedback circuit 64' (stemming from the output of the comparator 62'), as shown, loops back in two directions to select the subsequent voltage to corresponding reference voltage capacitors (exemplified as 72' and 72" in FIG. 8) of the feedback circuit 64'.

Figure 8:
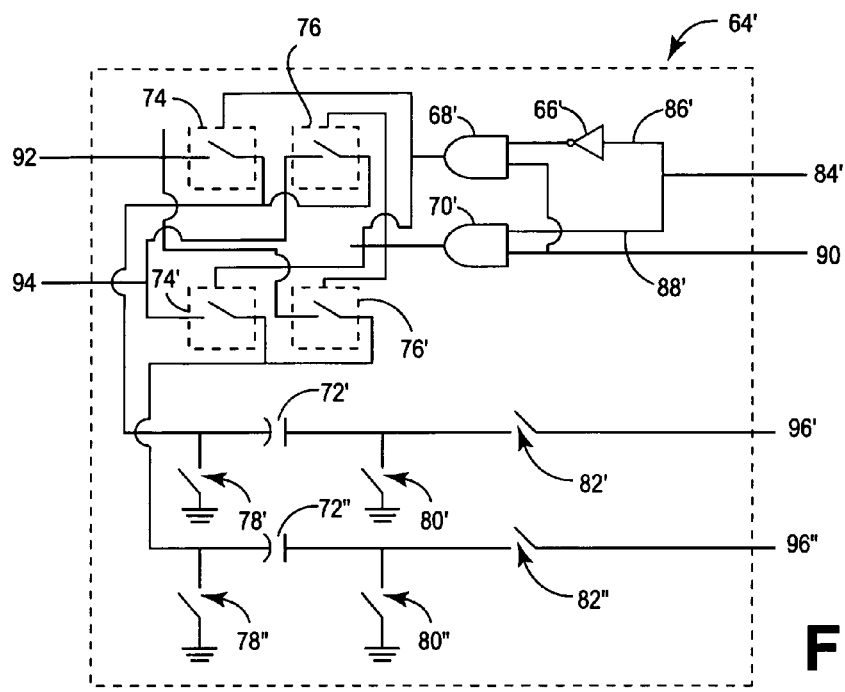
FIG. 8 is an exemplary feedback circuit of the partial ADC circuit of FIG. 7 in accordance with certain embodiments of the invention.

FIG. 8 shows various components of the feedback circuit 64' in accordance with certain embodiments of the invention. As illustrated, in certain embodiments, the feedback circuit 64' includes a NOT gate 66', a pair of AND gates 68' and 70', a pair of reference voltage capacitors 72' and 72", and a plurality of switches. In certain embodiments, the feedback circuit 64 includes switches 74', 74", 76', 76", 78', 78", 80', 80", 82', and 82". In use, the output of the comparator 62' (shown in FIG. 7) is connected to an input 84' of the feedback circuit 64'. As shown, the input 84' is divided into two signal paths 86' and 88'. The signal paths 86' and 88' are each connected to a first input of respective AND gates 68' and 70'; however, one of the signal paths, e.g., signal path 86', is sent through the NOT gate 66' prior to its connection to its corresponding AND gate, e.g., AND gate 68'. The second input of each of the AND gates 68', 70' is connected to a control signal 90. As shown, each of the outputs of the AND gates 68', 70' are respectively connected to control ends of the switches 74', 74" and 76', 76". The switches 74' and 76" are connected to one of at least two reference voltages (positive reference voltage 92), while the switches 74" and 76' are connected to another of the at least two reference voltages (negative reference voltage 94). As shown in FIG. 7, the output 96' of the switch 82' is connected to the positive input of the operational amplifier 32', and the output 96" of the switch 82" is connected to the negative input of the operational amplifier 32'.

As described above with reference to FIG. 4, as illustrated in FIG. 8, depending on the output of the comparator 62', the feedback circuit 64' enables one of the reference voltages 92 or 94 to be charged on the corresponding reference voltage capacitors 72' and 72". In turn, via use of the feedback circuit 64', in every phase of the partial ADC circuit 160, one of the sampling capacitors 114, 116 of the partial ADC circuit 160 and the reference voltage capacitor 72' of the feedback circuit 64' transfer their corresponding charges onto the integrating capacitor 112. Likewise, via use of the feedback circuit 64', in every phase of the partial ADC circuit 160, one of the sampling capacitors 138, 140 of the partial ADC circuit 160 and the reference voltage capacitor 72" of the feedback circuit 64' transfer their corresponding charges onto the integrating capacitor 136.

Figure 9:
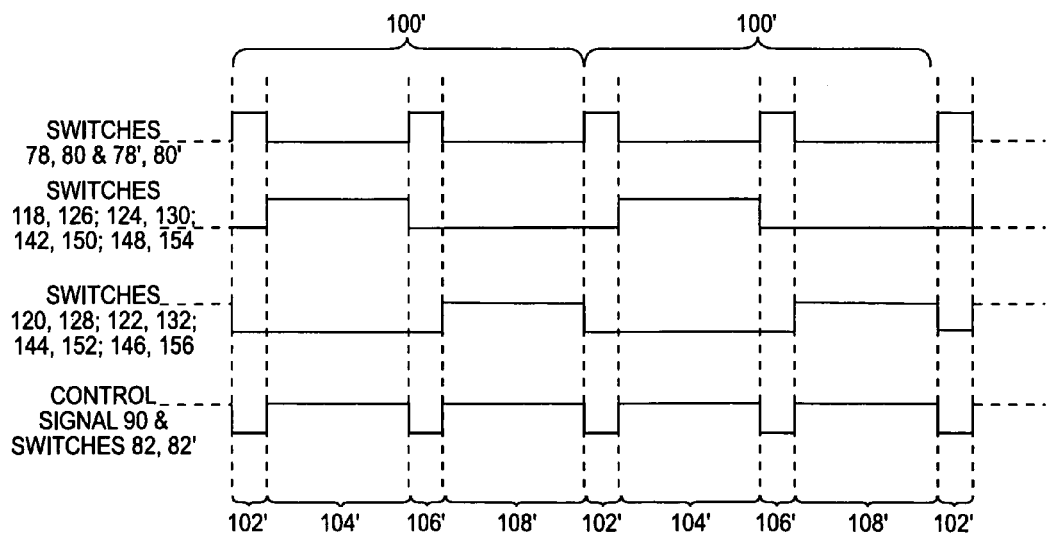
FIG. 9 is a time diagram for the partial ADC circuit of FIGS. 7 and 8.

FIG. 9 shows a clock diagram corresponding to the functioning of the circuits of FIGS. 7 and 8 in accordance with certain embodiments of the invention. As shown, in certain embodiments, each clock cycle 100' has a first phase 102', a second phase 104', a third phase 106', and a fourth phase 108'. Similar to the clock diagram in FIG. 5, the second and fourth phases 104', 108' represent the sampling and integration phases of the integrator circuit 110. Additionally, like the clock diagram of FIG. 5, the clock cycles 100' are again extended to include the first and third phases 102' and 106'. The first and third phases 102' and 106' each involve the discharging of the reference voltage capacitors 72 and 72' in the feedback circuit 64' of the ADC circuit 160 prior to the initiation of the respective second and fourth phases 104' and 108'. As such, it should again be appreciated that the use of the integrator circuit 110 of FIG. 6 would not always require the inclusion of such first and third phases 102' and 106' to its clock cycle. In turn, while the ADC circuit of FIG. 7 and clock diagram of FIG. 9 illustrate certain applications for the integrator circuit 110 of FIG. 6, the integrator circuit 110 should not be so limited.

With reference to FIGS. 7 and 8, in certain embodiments, during the first and third phases 102' and 106' of each clock cycle 100' of FIG. 9, only the switches 78', 80' and 78", 80" of the feedback circuit 64' shown in FIG. 8 are closed, while the control signal 90 is switched low and the other switches 118–132, 142–156, and 82', 82" are opened. As such, in certain embodiments, the first phase 102' involves both sides of both of the reference voltage capacitors 72', 72" being connected to ground via the respective switches 78', 80' and 78", 80", resulting in complete discharge of the corresponding reference voltage capacitors 72', 72" prior to the beginning of the second phase 104'.

The time period required to discharge the reference voltage capacitors 72', 72" in the first and third phases 102', 106' is generally short in comparison to the time periods required for the sampling/integrating phases of the integrator circuit 110 (i.e., the second and fourth phases 104', 108' of the ADC circuit 160). As shown, the time periods of each of the first and third phases 102', 106' can be the same; however, the invention should not be limited as such.

With reference to FIGS. 7–9, following discharge of the reference voltage capacitors 72' and 72" in the first phase 102' of the clock cycle 100', the second phase 104' begins. As such, the input voltage 134 is generally connected to one of the corresponding sampling capacitors (e.g., sampling capacitor 114), while the operational amplifier 32 is generally connected to the other corresponding sampling capacitor (e.g., sampling capacitor 116). Simultaneously, the input voltage 158 is generally connected to one of the corresponding sampling capacitors (e.g., sampling capacitor 138), while the operational amplifier 32 is generally connected to the other corresponding sampling capacitor (e.g., sampling capacitor 140). Accordingly, the switches 118, 126; 124, 130; 142, 150; 148, 154; and 82', 82" are closed and the control signal 90 is switched high in the second phase 104', while the other switches 120, 122, 128, 132, 144, 146, 152, 156, 78', 78", 80', and 80" are opened. As such, the sampling capacitors 114, 138 are charged respectively via the input voltages 134, 154 and the voltage on the sampling capacitors 116, 140 is generally discharged respectively to the integrating capacitors 112, 136 via the operational amplifier 32'. The output voltages of the operational amplifier 32' charging the integrating capacitors 112, 136 are likewise applied to the inputs of the comparator 62'. As shown in FIGS. 7–8, the output of the comparator 62' feeds into the input 84' of the feedback circuit 64' and is applied to both of the signal paths 86', 88' therein. As described above with reference to FIG. 4, depending on the output of the comparator 62', one of the reference voltages, 92 or 94, is applied to corresponding ends of the reference voltage capacitors 72', 72". In turn, the corresponding reference voltage 92 or 94 provides a subsequent charge to the corresponding integrating capacitors 112, 136.

As shown, the time periods of each of the second and fourth phases 104', 108' can be the same; however, the invention should not be limited as such. In certain embodiments, in order to increase the operating speed of the ADC circuit 160, the time period for the second and fourth phases 104', 108' is generally limited, but only to a period during which complete sampling and integration functionalities of the corresponding phases can be completed.

Following completion of the second phase 104' of each clock cycle 100', the third phase 106' begins. As such, as illustrated in FIG. 9, only the switches 78', 80' and 78", 80" of the feedback circuit 64' shown in FIG. 8 are closed, while the other switches 118–132, 142–156, and 82', 82" are opened and the control signal 90 is off. As such, both sides of the reference voltage capacitors 72', 72" are again respectively connected to ground via the switches 78', 80' and 78", 80", resulting in complete discharge of the reference voltage capacitors 72', 72" prior to the beginning of the fourth phase 108'.

With continued reference to FIGS. 7–9, following discharge of the reference voltage capacitors 72' and 72" in the third phase 106' of the clock cycle 100', the fourth phase 108' begins. Since the example provided herein included the sampling capacitor 114 previously being connected to the input voltage 134 in the second phase 104', the sampling capacitor 116 is generally connected to the input voltage 134 and the sampling capacitor 114 is generally connected to the operational amplifier 32'. Simultaneously, since the example provided herein included the sampling capacitor 138 previously being connected to the input voltage 158 in the second phase 104', the sampling capacitor 140 is generally connected to the input voltage 158 and the sampling capacitor 138 is generally connected to the operational amplifier 32'. As such, the control signal 90 is switched high and the switches 120, 128; 122, 132; 144, 152; 146, 156, and 82', 82" are closed in the fourth phase 108', while the other switches 118, 124, 126, 130, 142, 148, 150, 154, 78', 78", 80', and 80" are opened. As such, the sampling capacitors 116, 140 are charged respectively via the input voltages 134, 154 and the voltage on the sampling capacitors 114, 138 is generally discharged respectively to the integrating capacitors 112, 136 via the operational amplifier 32'. The output voltages of the operational amplifier 32 charging the integrating capacitor 34 are likewise applied to the inputs of the comparator 62'. As shown in FIGS. 7–8, the output of the comparator 62' feeds into the input 84' of the feedback circuit 64' and is applied to both of the signal paths 86', 88' therein. As described above with reference to FIG. 4, depending on the output of the comparator 62', one of the reference voltages, 92 or 94, is applied to the corresponding ends of the reference voltage capacitors 72', 72". In turn, the corresponding reference voltage 92 or 94 provides a subsequent charge to the corresponding integrating capacitors 112, 136.

As should be appreciated, the second and fourth phases 104', 108' of the ADC circuit 160 could be switched with each other in the clock cycles 100' of FIG. 9 without having any effect on the functioning of the circuit 160. The second and fourth phases 104', 108' are merely described and illustrated as such for exemplary purposes. As such, the invention should not be limited as such.

Figure 10:
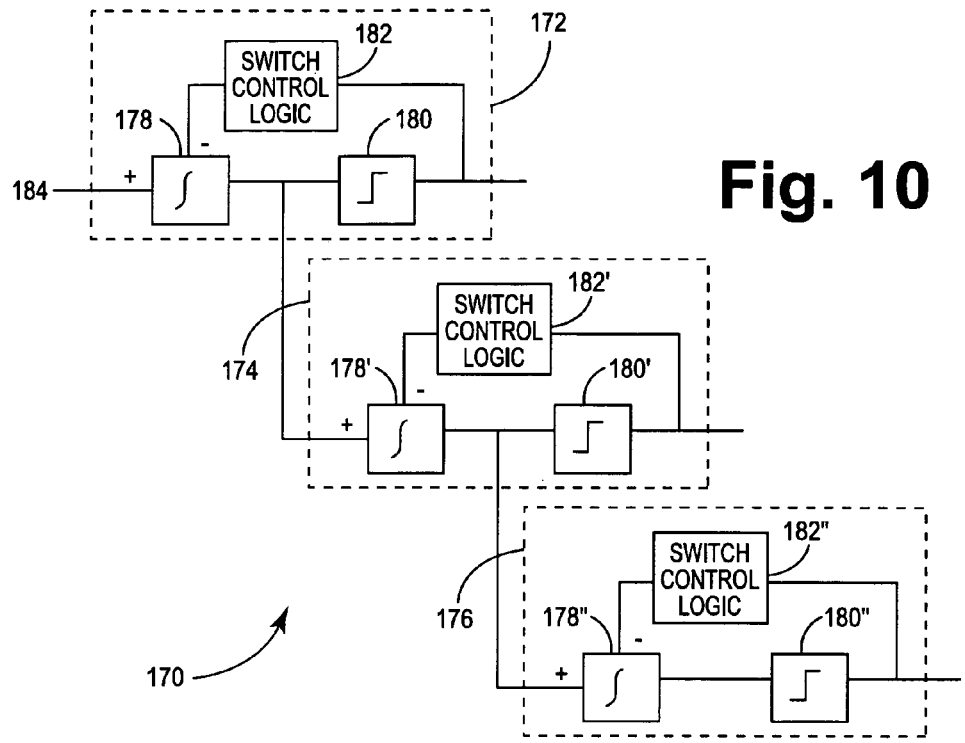
FIG. 10 is a block diagram of a multi-order, multi-stage circuit with each stage including the integrator circuit of either FIG. 2 or FIG. 6 in accordance with certain embodiments of the invention.

As described above, the ADC circuits 60 and 160 are single-order, single-stage circuits. In certain embodiments, the integrator circuit 30 of FIG. 2 and the integrator circuit 160 of FIG. 7 can also be used in multi-order, multi-stage circuits. FIG. 10 illustrates a circuit block diagram illustrating an exemplary multi-order, multi-stage circuit 170 in accordance with certain embodiments of the invention. In certain embodiments, as shown in FIG. 10, the circuit 170 can be a third-order, triple-stage circuit; however, it should be appreciated that the invention should not be limited as such.

As shown, the circuit 170 has a first stage 172, a second stage 174, and a third stage 176. In certain embodiments, each stage 172, 174, and 176 of the circuit 170 can be constructed as either the partial ADC circuit 60 of FIG. 3 or the partial ADC circuit 160 of FIG. 7. The partial ADC circuit 60 of FIG. 3 is described herein as an example to illustrate the functioning of the multi-order, multi-stage circuit 170; however, the invention should not be limited as such. Further, in certain embodiments, each stage can be constructed similarly; however, it should be appreciated that one or more of the stages 172, 174, and 176 could be designed with other non-ADC circuits that incorporate integrators as well, or alternatively replaced or substituted with other non-integrating stages and still be within the spirit of the invention.

As described above, in certain embodiments, each stage 172, 174, and 176 is similarly configured. For example, the first stage 172 has an integrator circuit 178, a comparator 180, and feedback circuit 182. Accordingly, the second stage 174 has an integrator circuit 178', a comparator 180', and feedback circuit 182', and the third stage has an integrator circuit 178", a comparator 180", and feedback circuit 182".

In use, the integrator circuit 178 of the first stage 172 receives an input voltage 184. As described above with reference to FIG. 3, the output of the integrator circuit 178 forms an input to the comparator 180. In turn, the output of the comparator 180 is fed into the feedback circuit 182 of the first stage 172, which, as described above with reference to FIGS. 3 and 4, correspondingly feeds back into the integrator circuit 178 of the first stage 172 for subsequent integration via the first stage 172.

As shown, the output of the integrator circuit 178 also forms an input to the integrator circuit 178' of the second stage 174. In turn, the output of the integrator circuit 178' forms an input to the comparator 180'. As such, the output of the comparator 180' is fed into the feedback circuit 182' of the second stage 174, which, as described above with reference to FIGS. 3 and 4, correspondingly feeds back into the integrator circuit 178' of the second stage 174 for subsequent integration via the second stage 174.

As shown, the output of the integrator circuit 178' also forms an input to the integrator circuit 178" of the third stage 176. In turn, the output of the integrator circuit 178" forms an input to the comparator 180". As such, the output of the comparator 180" is fed into the feedback circuit 182" of the third stage 176, which, as described above with reference to FIGS. 3 and 4, correspondingly feeds back into the integrator circuit 178" of the third stage 176 for subsequent integration via the third stage 176.

As should be appreciated, the stages 172, 174, and 176 of the circuit 170 all function in corresponding manners with respect to similar clock cycles. As such, as exemplified in the clock diagram of FIGS. 3–5, the integrator circuit 178 of the first stage 172 alternatively provides sampling/integration functions with respect to sampling capacitors (referenced as 36, 38 in FIG. 3) of the integrator circuit 178 in two distinct phases. Similarly, the integrator circuit 178' of the second stage 174 alternatively provides sampling/integration functions with respect to sampling capacitors of the integrator circuit 178' in two distinct phases, and the integrator circuit 178" of the third stage 176 alternatively provides sampling/ integration functions with respect to sampling capacitors of the integrator circuit 178" in two distinct phases.

FIG. 11 shows an exemplary clock diagram for the second stage 174 of the circuit 170 of FIG. 10. As shown, each clock cycle 190 of the clock diagram involves a first phase 192, a second phase 194, a third phase 196, and a fourth phase 198, similar to the clock diagrams illustrated and described with respect to FIGS. 4 and 9. With reference to FIG. 10, the first and third phases 192, 196 again involve the reference voltage capacitor(s) of the feedback circuit 182' being discharged prior to sampling/integration functioning of the integrator circuit 178' during the second and fourth phases 194, 198. As such, the operation of the second stage 174 of the circuit 170 would function similarly as already discussed with respect to either the clock diagram of FIG. 4 or the clock diagram of FIG. 9. However, unlike the clock diagrams of FIGS. 4 and 9, the second and fourth phases 194, 198 must now be of sufficient duration so that the integrator capacitor(s) of the integrator circuit 178' of the second stage 174 can stabilize sufficiently while being connected as a load with the sampling capacitor(s) of the integrator circuit 178" of the third stage 176.

It will be appreciated the embodiments of the present invention can take many forms. The true essence and spirit of these embodiments of the invention are defined in the appended claims, and it is not intended the embodiment of the invention presented herein should limit the scope thereof.

The invention claimed is:

1. An integrator, comprising circuitry including an operational amplifier and first and second sampling capacitors, the first and second sampling capacitors positioned along separate signal paths and each in series with an analog signal input and a first input of the operational amplifier, the circuitry configured to concurrently sample and integrate signals received at the analog signal input,
   wherein the circuitry samples using the first sampling capacitor while integrating using the second sampling capacitor,
   wherein the circuitry samples using the second sampling capacitor while integrating using the first sampling capacitor,
   wherein the circuitry samples using the second sampling capacitor while integrating using the first sampling capacitor during a second phase of the clock cycle.

2. The integrator of claim 1, further comprising a plurality of switches for switching portions of the integrator circuit between sampling an integrating.

3. The integrator of claim 1, wherein the sampling and integrating occur during a first phase of a clock cycle.

4. An integrator, comprising circuitry including an operational amplifier and first and second sampling capacitors, the first and second sampling capacitors positioned along separate signal paths and each in series with an analog signal input and a first input of the operational amplifier, the circuitry configured to concurrently sample and integrate signals received at the analog signal input,
   wherein the circuitry further includes third and fourth sampling capacitors, and the third and fourth sampling capacitors being positioned along separate signal paths in series with an further analog signal input and a second input of an operational amplifier.

5. The integrator of claim 4, wherein the circuitry samples using the third sampling capacitor while integrating using the fourth sampling capacitor during the first phase of the clock cycle.

6. The integrator of claim 5, wherein the circuitry samples using the fourth sampling capacitor while integrating using the third sampling capacitor during a second phase of the clock cycle.

7. An integrator, comprising a switched capacitor sampling network having an input for receiving an analog signal, a first portion of the sampling network being in a sampling mode during a first phase of a clock and being in an integrating mode during a second phase of the clock, a second portion of the sampling network being in the integrating mode during the first phase of the clock and being in the sampling mode during the second phase of the clock,
   wherein the analog signal input is electrically connected to the portion of the sampling network operating in the sampling mode,
   wherein the switched capacitor sampling network includes first and second sampling capacitors positioned along separate signal paths and each in series with the analog signal input and a first input of the operational amplifier.

8. The integrator of claim 7, wherein the switched capacitor sampling network includes an operational amplifier electrically connected to the portion of the sampling network operating in the integrating mode.

9. The integrator of claim 7, wherein the switched capacitor sampling network includes third and fourth sampling capacitors positioned along separate signal paths and each in series with the analog signal input and a second input of the operational amplifier.

10. The integrator of claim 9, wherein the switched capacitor sampling network is configured as a differential circuit, the first and second inputs of the operational amplifier configured for receiving a differential signal.

11. The integrator of claim 9, wherein the first portion of the switched capacitor network includes the first and third sampling capacitors and the second portion of the switch capacitor network includes the second and fourth capacitors.

\* \* \* \* \*